(12) United States Patent
Harris et al.

(10) Patent No.: US 7,280,364 B2
(45) Date of Patent: Oct. 9, 2007

(54) APPARATUS AND METHOD FOR MULTIPROCESSOR CIRCUIT BOARD

(75) Inventors: Shaun L. Harris, Mckinney, TX (US); Steven A. Belson, Plano, TX (US); Eric C. Peterson, McKinney, TX (US); Gary W. Williams, Rowlett, TX (US); Christian L. Belady, Mckinney, TX (US); Jeffrey P. Christenson, Plano, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 330 days.

(21) Appl. No.: 10/996,722

(22) Filed: Nov. 24, 2004

(65) Prior Publication Data

US 2006/0109623 A1    May 25, 2006

(51) Int. Cl.
    *H05K 7/20* (2006.01)

(52) U.S. Cl. .................... 361/721; 361/694; 361/695; 361/704; 361/715

(58) Field of Classification Search ............... 361/721
See application file for complete search history.

(56) References Cited

U.S. PATENT DOCUMENTS

| | | | |
|---|---|---|---|
| 6,304,450 B1* | 10/2001 | Dibene et al. | 361/704 |
| 2004/0218367 A1* | 11/2004 | Lin et al. | 361/721 |
| 2006/0152907 A1* | 7/2006 | Rathmann | 361/720 |

* cited by examiner

*Primary Examiner*—Gregory D. Thompson

(57) ABSTRACT

One embodiment includes an electronic assembly having a first printed circuit board (PCB) coupled to a second PCB. The second PCB has at least two processors and is disposed above the first PCB. A thermal dissipation device is disposed above the second PCB, dissipates heat away from the two processors, and provides an airflow path. A power system is adjacent the thermal dissipation device and in a pathway of the airflow path.

20 Claims, 3 Drawing Sheets

APPARATUS AND METHOD FOR MULTIPROCESSOR CIRCUIT BOARD

BACKGROUND

Circuit boards may include a plurality of heat-generating devices that must be cooled in order to operate within a specified operating temperature. If these heat-generating devices are not sufficiently cooled, then the devices can exhibit a decrease in performance or even permanently fail.

In some electronic systems, heatsinks are used to dissipate heat and cool heat-generating devices. Heatsinks facilitate heat exchange between the heat-generating device and the environment. Heat transfers from the heat-generating device to the heatsink. In some instances, fans direct airflow across the heatsink to increase thermal dissipation.

Packing density is also an important criterion in many electronic systems. One way to reduce the actual size of an electronic device is to more closely position the electrical components together. Electrical components within a circuit board, however, are generally already tightly confined, and additional space may not be readily available. Further, if heat-generating components are positioned more closely together, then heat must be sufficiently dissipated so the components properly operate.

Some electronic systems utilize several printed circuit boards with many different electronic components interconnected to the circuit boards. As these electronic systems decrease in size and increase in performance, heat dissipation and packing density become increasingly important.

SUMMARY

Embodiments in accordance with the present invention are directed to an apparatus and method for multiprocessor circuit boards. In one exemplary embodiment, an electronic assembly has a first printed circuit board (PCB) coupled to a second PCB. The second PCB has at least two processors and is disposed above the first PCB. A thermal dissipation device is disposed above the second PCB. The thermal dissipation device dissipates heat away from the two processors and provides an airflow path. A power system is adjacent the thermal dissipation device and in a pathway of the airflow path.

In another exemplary embodiment, a method comprises connecting two processors to a first circuit board; connecting the first circuit board to a second circuit board to create a space between the first and second circuit boards; connecting a power system to the first circuit board so at least a portion of the power system extends into the space; and thermally dissipating heat away from both the two processors and the power system with a single thermal dissipation device.

Other embodiments and variations of these embodiments are shown and taught in the accompanying drawings and detailed description.

DETAILED DESCRIPTION

Figure 1:
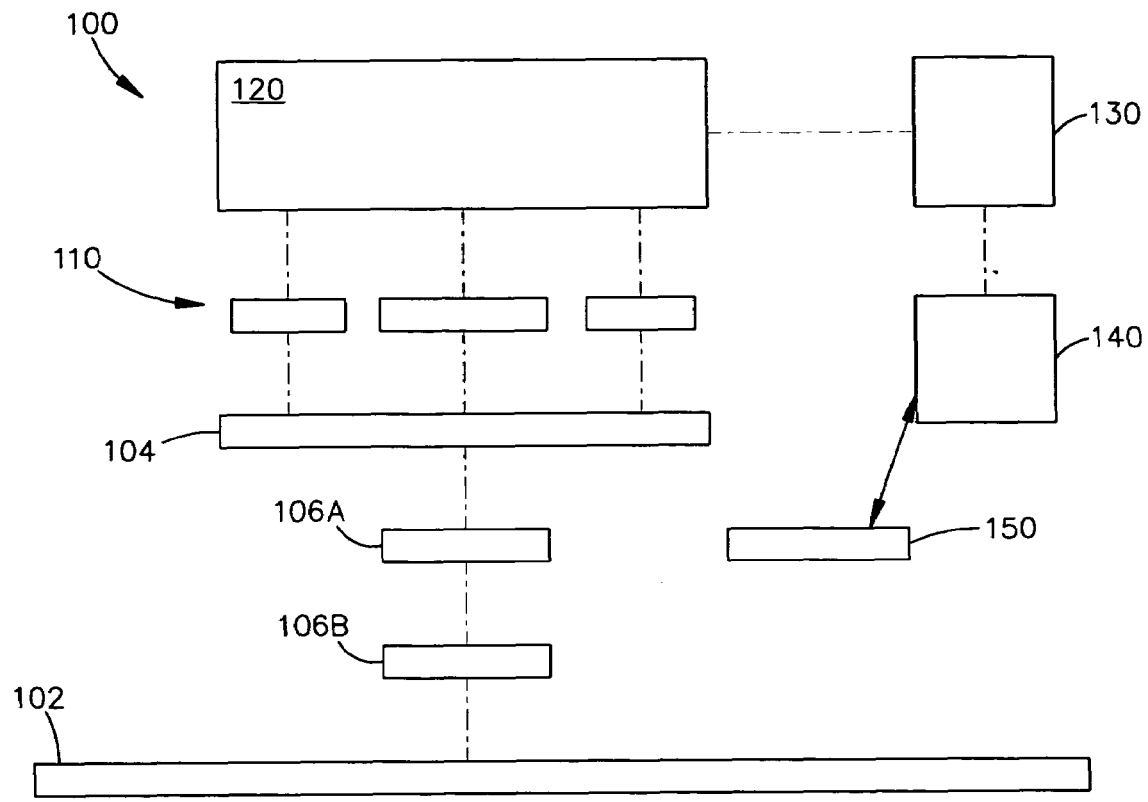
FIG. 1 is an exploded side view of a block diagram of an electronic assembly in accordance with an exemplary embodiment of the present invention.

FIGS. 1-5 show an electronic system or assembly 100 in accordance with an exemplary embodiment of the present invention. The electronic assembly 100 includes two printed circuit boards (PCB) or printed wiring boards (PWB) 102 and 104. The PCBs 102 and 104 can have a variety of configurations and still be within embodiments in accordance with the invention. By way of example, the PCBs can include power module circuit boards, voltage regulation module (VRM) circuit boards, controller boards (such as a special type of expansion board that contains a controller for a peripheral device), expansion boards (such as any board that plugs into an expansion slot of a computer), or modules. As another example, the PCB 102 can be a motherboard, and the PCB 104 can be a daughterboard.

A motherboard is a printed circuit board that can be used in a personal computer, server, or other electronic device. The motherboard (also known as a main board or system board) can provide attachment points for processors, graphics cards, sound cards, controllers, memory, ICs, modules, PCBs, and many other electronic components and devices in a computing system. The daughterboard can be utilized as an extension of the motherboard or other card or board. The daughterboard can have plugs, sockets, pins, connectors, or other attachments for the motherboard or other boards. Connectors 106A and 106B, for example, can be used to electrically couple the PCB 102 to the PCB 104. Connectors 106 provide a mechanical and electrical interface or connection between the PCBs and may include, for example, a removably connectable plug (male) and socket (female). Alternatively, a single connector can be used to connect the PCBs 102 and 104.

The PCBs 102 and 104 include a plurality of electronic components or devices. For example, the PCB 104 includes a plurality of heat-generating components or devices 110. These heat-generating devices include any electronic component that generates heat during operation. For example, heat-generating devices include, but are not limited to, electronic power circuits, application specific integrated circuits (ASICs), processors (such as a central processing unit (CPU) or digital signal processor (DSP)), discrete electronic devices (such as field effect transistors (FETs)), other types of transistors, or devices that require heat to be thermally dissipated from the device for the device to operate properly or within a specified temperature range. An ASIC can comprise an integrated circuit or chip that has functionality customized for a particular purpose or application. The PCBs 102 and 104 can also include a plurality of electronic components or device that may or may not generate heat or that may generate low or insignificant amounts of heat. Examples of such devices include, but are not limited to, resistors, capacitors, transistors, diodes, memories, etc.

The electronic assembly 100 can include at least one thermal dissipation device 120. The thermal dissipation device includes, but is not limited to, heat spreaders, cold plates, refrigeration (evaporative cooling) plates, heat pipes, mechanical gap fillers (such as a plurality of pins, rods, etc.), or other devices adapted to dissipate heat. Further, such thermal dissipation devices include heatsinks. A heatsink is a component designed to reduce the temperature of a heat-generating device or component, such as heat-generating components 110. A heatsink, for example, can dissipate heat of the electronic component into surrounding air or surrounding environment. Numerous types of heatsinks can be utilized with embodiments in accordance with the present invention. For example, embodiments can include heatsinks without a fan (passive heatsinks) or heatsinks with a fan (active heatsink). Other examples of heatsinks include extruded heatsinks, folded fin heatsinks, cold-forged heatsinks, bonded/fabricated heatsinks, and skived fin heatsinks. The thermal dissipation device, including heatsinks, can use liquids and phase change materials.

The electronic assembly 100 can also include a power supply or power system 130. An electrical connector or coupling device 140 connects the power system 130 to additional electronic components 150 and to the PCB 104. The connector 140, for example, can directly connect to the PCB 104 and couple the power system 130 to the PCB 104 and couple the components 150 to the power system 130 and/or PCB 104.

The power system 130 can include numerous embodiments for providing power to electronic components (such as heat-generating components 110) and/or PCBs (such as the PCB 104) within the electronic assembly 100. For example, the power system can be a factorized power architecture (FPA) module, a power converter, such as a direct current (DC) converter or DC-DC converter, AC-DC converter, DC linear regulator, DC switching regulator, or DC charge pump.

Figure 2:
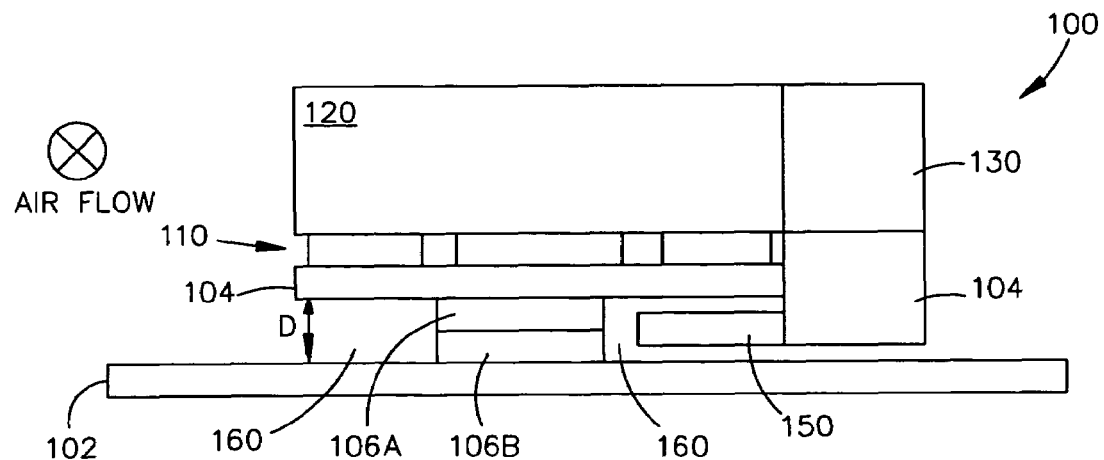
FIG. 2 is a side view of the electronic assembly of FIG. 1 with the electronic assembly being assembled together.
Figure 3:
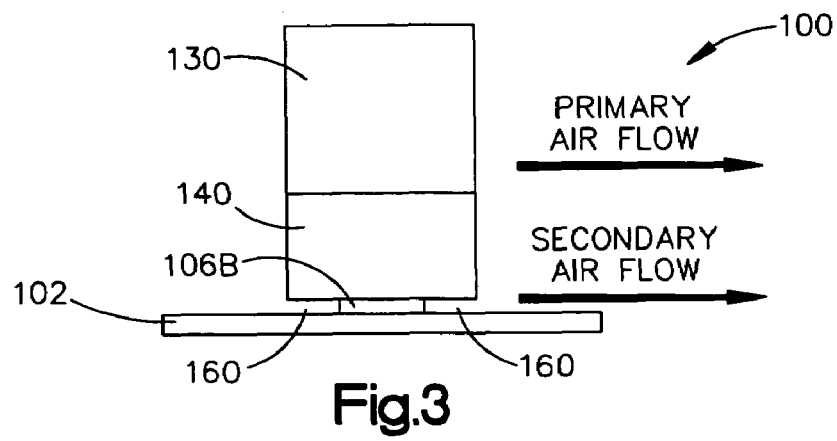
FIG. 3 is an end view of FIG. 2.
Figure 4:
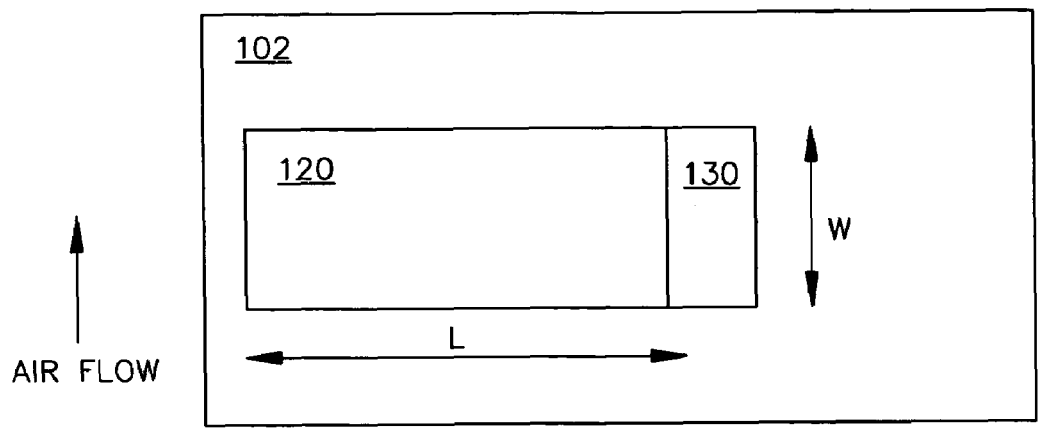
FIG. 4 is a top view of FIG. 2.
Figure 5:
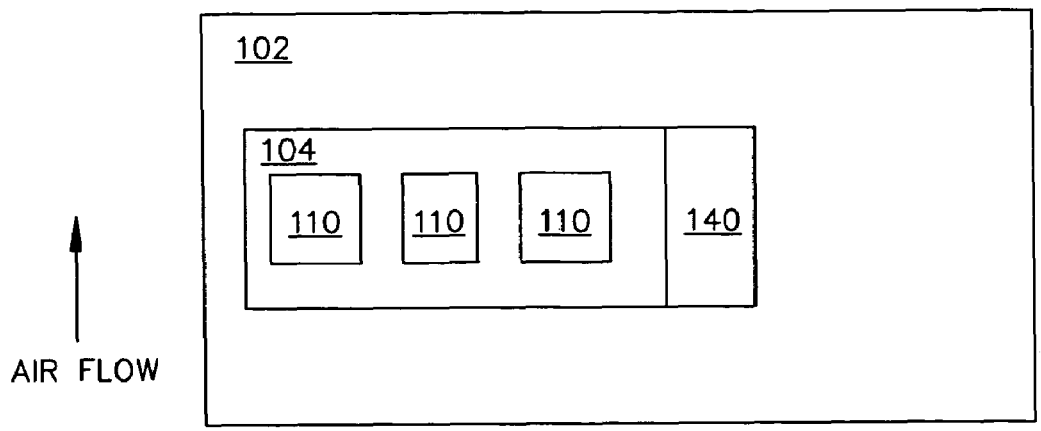
FIG. 5 is a top view of the FIG. 2 with the thermal dissipation device removed from the electronic assembly.

Looking now to FIGS. 2-5, thermal dissipation and packing density are discussed in more detail for the electronic assembly 100. Once connected, the PCB 102 is generally parallel to the PCB 104. The PCBs 102 and 104 are mechanically and electrically connected to form a vertical stacked-up configuration. In particular, the connectors 106A and 106B couple the PCBs together. The PCB 102 is separated from the PCB 104 by a distance "D" (see FIG. 2) that is equal to or approximately equal to the height or thickness of the connectors. 106A and 106B when connected together. Further, as best shown in FIG. 4, the PCB 104 can be defined to have a surface area equal to length "L" multiplied by width "W." As best shown in FIGS. 2 and 3, a volume of unused or empty space 160 exists between the PCB 102 and the PCB 104 when they are in a stacked-up configuration. The volume of unused or empty space 160 is generally equal to or approximately equal to the amount of space under the PCB 104 (or the PCB 104 and power system 130) minus such space occupied by the connectors 106A and 106B. In other words, the amount of unused space 160 equals (L×W×D) minus (volume of connectors 106A/106B):

In order to increase the packing density or increase an effective use of space in the electronic assembly 100, the unused space 160 can be occupied with electronic components. Such electronic components can include heat-generating or non-heat-generating devices. Preferably, these components include non-heat-generating devices or low heat-generating devices, such as electronic components that do not require the use of a thermal dissipating device to operate properly. As best shown in FIG. 2, the unused space 160 can include the electronic components 150. In one exemplary embodiment, these components 150 can include electronic components or elements associated with the power system 130. By way of example only, these components 150 include, but are not limited to, pulse width modulation (PWM) devices, switches, bit tests (such as testing the value of specific bits in memory or registers), and bus architecture (such as $I^2C$ buses). In another exemplary embodiment, these components 150 can be an independent and/or separate power system that provides power to the PCB 104.

As best shown in FIGS. 2-5, the thermal dissipation device 120 is positioned directly above the heat-generating components 110 of the PCB 104. Further, as best shown in FIGS. 2 and 3, the power system 130 is positioned adjacent to the thermal dissipation device 120 and directly above the PCB 104 or an imaginary plane of the PCB 104 (for example if a connector is used to extend the power system 130 from the PCB 104).

For purposes of illustration only, the electronic assembly is shown with an airflow direction as indicated with arrows in FIGS. 2-5 (the airflow being into the page and indicated with a circle and "X" in FIG. 2). The airflow can be provided, for example, with a fan or other device positioned within the electronic assembly 100 or within the thermal dissipation device 120. The airflow is directed in a pathway that is parallel to the PCBs 102 and 104. A primary airflow (shown in FIG. 3) is directed at and/or above the PCB 104. This primary airflow is directed at the thermal dissipating device 120, the power system 130, and the heat-generating components 110. Thus, the same airflow can be used to cool or dissipate heat simultaneously from the thermal dissipating device 120, the power system 130, and the heat-generating components.

As shown in FIG. 3, the airflow can include a secondary airflow. This secondary airflow is much weaker than the primary airflow. In other words, the volumetric airflow rate (cubic feet per minute, CFM) is less in the secondary airflow than in the primary airflow.

The secondary airflow passes between the PCB 102 and the PCB 104. In particular, the secondary airflow passes through the empty space 160. Preferably, non-heat-generating or low heat-generating devices are placed in the empty space and, thus, in the pathway of the secondary airflow. As shown in FIGS. 2 and 3, components 150 are placed in the empty space 160 since these components 150 do not require assistance of the thermal dissipating device 120 to operate properly.

Figure 6:
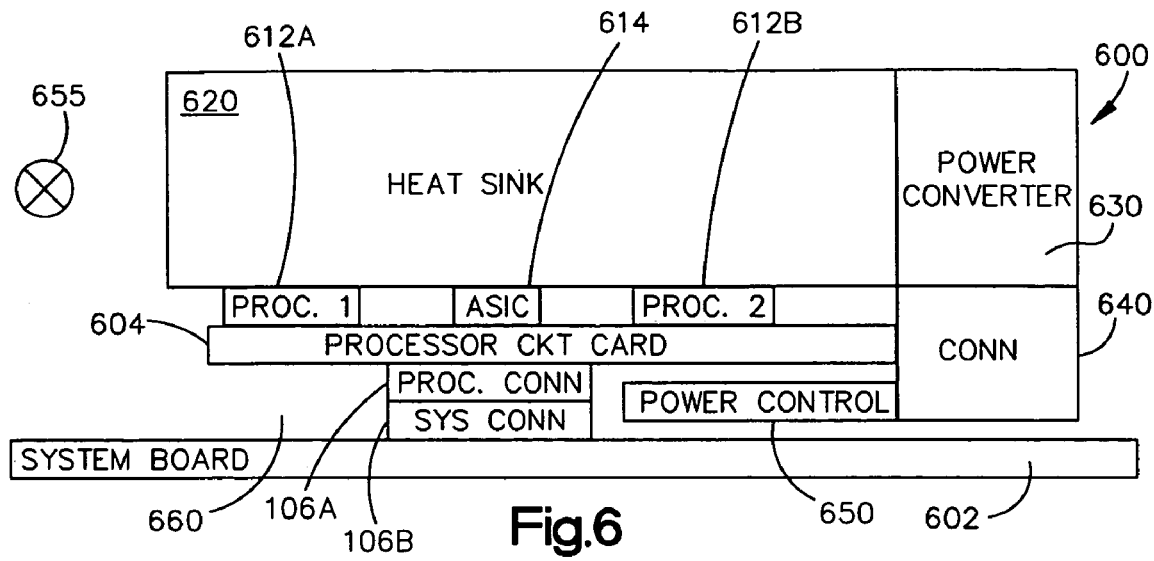
FIG. 6 is a side view of an exemplary embodiment of an electronic assembly.

Various different electronic components and PCBs can be combined into embodiments in accordance with the invention. FIG. 6 illustrates one such exemplary embodiment as electronic assembly 600. In this figure, a system board 602 connects to a processor circuit card 604 with a processor connector 106A and a system connector 106B. The processor circuit card 604 includes a plurality of processors and ASICs. For example, the processor circuit card 604 can have two processors 612A and 612B and an ASIC 614. A heatsink 620 is positioned directly above the processor circuit card 604 to cool and dissipate heat for the processors 612A, 612B and ASIC 614. A power converter 630 is positioned adjacent the heatsink 620 and above the processor circuit card 604. An electrical three-way connector 640 couples or connects the power converter 130 to the processor circuit card 604 and the power control 650 (the power control 650 providing power control functionality for the power converter 630).

As shown, the power converter 630 is adjacent the heatsink 620 and above the processor circuit card 604 so as to be in a direct airflow pathway 655 of the heatsink 620. As such, the heatsink 620 simultaneously cools or dissipates heat for both the heat-generating components on the processor circuit card 604 (example, the processors 612A, 612B and ASIC 614) and the power converter 630.

The electronic assembly 600 includes space 660 between the processor circuit card 604 and the system board 602. This space 660 is at least partially occupied with the power control 650 to increase packing density or packing efficiency for the electronic assembly 600.

Figure 7:
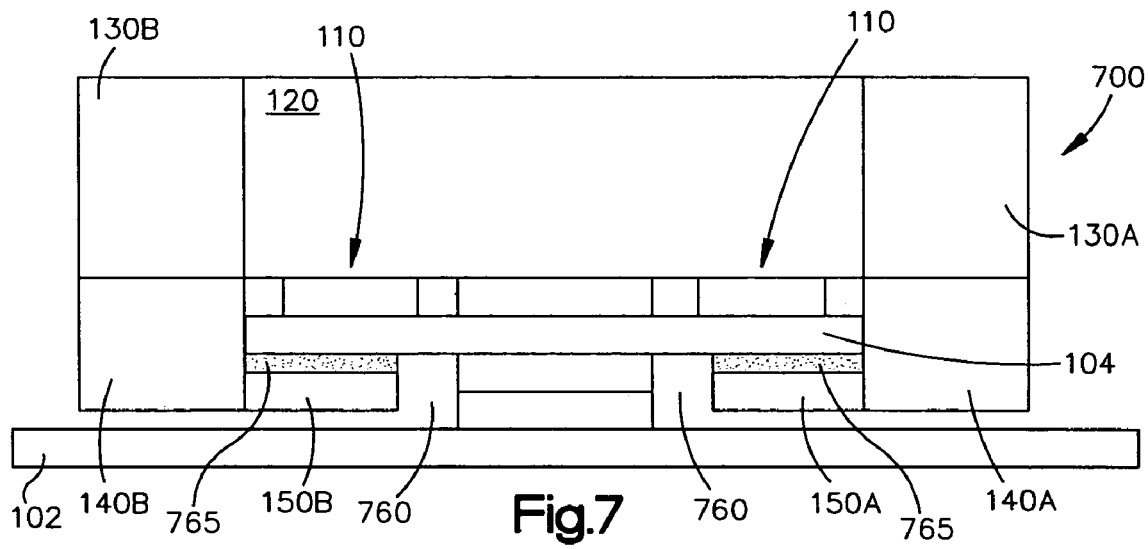
FIG. 7 is a side view of another exemplary embodiment of an electronic assembly.

FIG. 7 shows another exemplary electronic assembly 700 in accordance with the present invention. The electronic assembly 700 is generally similar to the electronic assembly 100 shown in FIGS. 2-5, and like reference numerals are used in FIG. 7. As one difference, the electronic assembly 700 includes two power systems 130A and 130B, two connectors 140A and 140B, and two electronic components 150A and 150B.

Both power systems 130A and 130B are in the direct airflow pathway of the thermal dissipation device 120. As such, the thermal dissipation device 120 simultaneously cools or dissipates heat for both power systems 130A, 130B and heat-generating components 110 on the PCB 104.

The electronic assembly 700 includes space 760 between the PCB 102 and the PCB 104. This space 760 is at least partially occupied with the two electronic components 150A and 150B to increase packing density or packing efficiency for the electronic assembly 700. A conductive material or filler 765 can be placed between a top surface of the components 150A, 150B and a bottom surface of the PCB 104. This conductive material can assist in heat transfer or heat exchange from the components 150A, 150B to the PCB 104.

The two powers systems 130A and 130B may be redundant power systems. Redundant power systems can serve as a duplicate for preventing failure upon failure of one of the power systems. In other words, if one power system fails, then the other power system can supply sufficient power to the system to continue operation of the system. As an example, if power system 130A fails, then power system 130B could provide sufficient power to the PCB 104 and corresponding heat-generating components 110.

Figure 8:
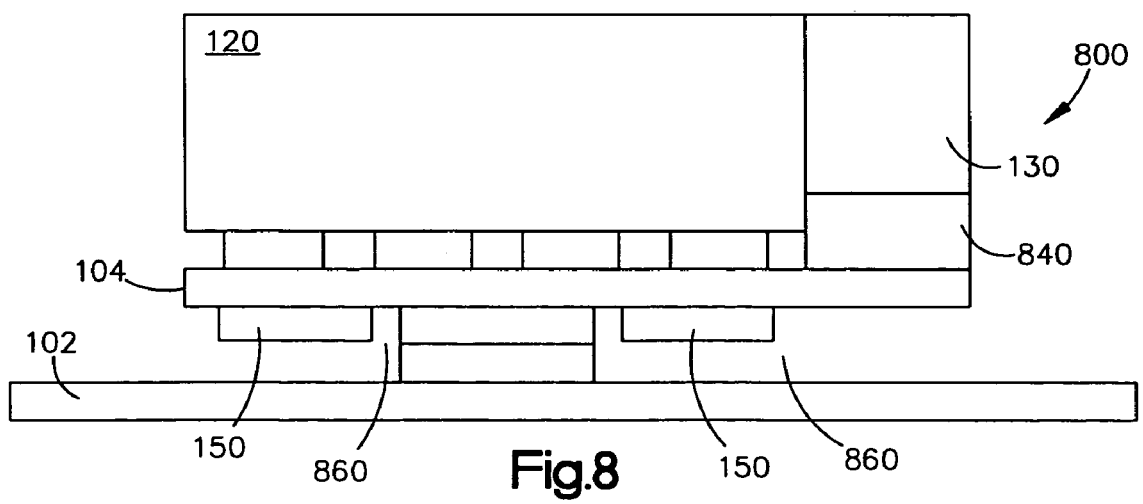
FIG. 8 is a side view of another exemplary embodiment of an electronic assembly.

FIG. 8 shows another exemplary electronic assembly 800 in accordance with the present invention. The electronic assembly 800 is generally similar to the electronic assembly 100 shown in FIGS. 2-5, and like reference numerals are used in FIG. 8. As one difference, the electronic assembly 800 includes a power system 130 connected to a two-way connector 840. The connector 840 connects or couples the power system 130 to the PCB 104. Unlike FIGS. 2-5, the electronic components 150 are not directly connected or coupled to the connector 840, which is connected to a top surface of the PCB 104. Instead, the electronic components 150 are directly connected to the underside of the PCB 804. These components extend into the space 860 between the PCB 102 and the PCB 104. In one exemplary embodiment, the electronic components 150 comprise a power system that is separate and independent from power system 130. These two power systems, for example, can be redundant power systems.

As used herein, the term "module" means a unit, package, or functional assembly of electronic components for use with other electronic assemblies or electronic components. A module may be an independently-operable unit that is part of a total or larger electronic structure or device. Further, the module may be independently connectable and independently removable from the total or larger electronic structure.

Embodiments in accordance with the present invention can utilize a variety of modules. As an example, looking to FIG. 2, the PCB 104 can be a processor module that includes heat-generating components 110 (such as two separate processors, an ASIC, and memory all on the same board or card). As another example, the power system 130 could connect, via connector 140 for example, to the processor module to form a processor/power module. The thermal dissipation device 120 can be connected to the processor module and/or the processor/power module. FIG. 2, for example, shows such a module connected, via connectors 106A and 106B, to PCB 102. This module can be removably connected to the PCB 102. FIG. 7 shows another example of a processor/power module (having two power systems 130A, 130B) connected to the PCB 102.

Embodiments in accordance with the present invention can utilize a modular connective architecture. If a particular electronic component (including PCBs) or device fails or otherwise needs to be replaced, the electronic component can be removed from the electronic assembly and replaced with a new and/or different component. As such, the electronic assemblies can be constructed with standardized electronic components and/or dimensions to enable flexibility and variety of use and exchange of components. Looking to FIG. 2 as an example, if power system 130 fails or needs to be replaced, the power system 130 can be disconnected or uncoupled from the connector 140 and removed from the electronic assembly 100 while the PCB 104 remains mechanically connected to the PCB 102. A new and/or different power assembly can thereafter be connected to the connector 140 and utilized with the electronic assembly 100.

In order to facilitate modularity within the electronic assembly, various removable connections between electronic components can be utilized. By way of example, such connections include, but are not limited to, land grid arrays (LGAs), pin grid arrays (PGAs), plugs (example, male), sockets (example, female), pins, connectors, soldering, or other removable or disconnectable attachments.

Embodiments in accordance with the invention can be utilized in a wide variety of different methods and embodiments. For example, embodiments in accordance with the present invention can utilize embodiments taught in U.S. patent application Ser. No. 10/800,837 filed Mar. 15, 2004, entitled "Multi-Processor Module" and incorporated herein by reference. As another example, an exemplary method can comprise connecting plural heat-generating components to a first circuit board. The heat-generating components can include plural processors, ASICs, and other devices. The first circuit board can be connected to a second circuit board in a vertical stacked-up configuration to create a space between the first and second circuit boards. A power system can be connected to the first circuit board. A connector can couple the power system to the first circuit board and electronic components, such as control components associated with the power system. These electronic components can at least partially extend into the space between the first and second circuit boards. A thermal dissipation device can thermally dissipate heat away from both heat-generating devices and the power system. Further, the thermal dissipation device can generate at least a primary airflow path that is directed toward both the thermal dissipation device and the power system. A second airflow path can also be generated. This second airflow path can be directed through the space and toward a portion of the power system that extends into the space. The space can be filled with electronic components to increase the packing density of the electronic assembly. In one exemplary embodiment, these electronic components can be low or non-heat-generating components.

One skilled in the art will appreciate that a discussion of various methods should not be construed as steps that must proceed in a particular order. Additional steps may be added, some steps removed, or the order of the steps altered or otherwise changed.

While the invention has been disclosed with respect to a limited number of embodiments, those skilled in the art will appreciate, upon reading this disclosure, numerous modifications and variations. It is intended that the appended claims cover such modifications and variations and fall within the true spirit and scope of the invention.

What is claimed is:

1. An electronic assembly, comprising:
  a first printed circuit board (PCB); and
  a module including a second PCB having (i) at least two processors, (ii) a thermal dissipation device being disposed above the second PCB, dissipating heat away from the two processors, and providing an airflow path, and (iii) a power supply supplying power to the at least two processors and being adjacent the thermal dissipation device and in a pathway of the airflow path, wherein the module is removably coupled to and disposed above the first PCB.

2. The electronic assembly of claim 1 further comprising electronic components coupled, via a connector, to the power system, the electronic components extending into a space defined under the second PCB and between the first and second PCBs.

3. The electronic assembly of claim 1 further comprising a second power supply adjacent the thermal dissipation device and in the pathway of the airflow path.

4. The electronic assembly of claim 3, wherein the second power supply is redundant to the power supply.

5. The electronic assembly of claim 1, wherein the thermal dissipation device generates an airflow.

6. The electronic assembly of claim 1 further comprising a controller for the power supply, wherein the controller is disposed underneath the second PCB and between the first and second PCBs.

7. The electronic assembly of claim 1 further comprising control elements for the power supply, the control elements including a pulse width modulator located in a space defined between the first and second PCBs.

8. A method, comprising:
  connecting two processors to a first circuit board;
  connecting the first circuit board to a second circuit board to create a space between the first and second circuit boards;
  connecting a power system to the first circuit board for supplying power to the first circuit board so at least a portion of the power system extends into the space; and
  thermally dissipating heat away from both the two processors and the power system with a single thermal dissipation device.

9. The method of claim 8 further comprising generating a primary airflow path that is directed toward both the thermal dissipation device and the power system.

10. The method of claim 9 further comprising generating a secondary airflow path that is directed through the space and toward the portion of the power system that extends into the space.

11. The method of claim 8 further comprising filling the space with electronic components that do not require heat to be thermally dissipated for the electronic device to operate properly.

12. The method of claim 8 further comprising positioning the power system adjacent the thermal dissipation device and above the first circuit board.

13. The method of claim 8 further comprising:
  connecting power control components to the power system; and
  extending the power control components under the first circuit board into the space.

14. The method of claim 8 further comprising:
  disconnecting the power system from the first circuit board without disconnecting the first circuit board from the second circuit board;
  connecting a different power system to the first circuit.

15. An apparatus, comprising:
  first printed circuit board (PCB);
  second PCB having at least two heat-generating devices;
  means for connecting the first and second PCBs to form a space between the first and second PCBs;
  means for powering the second PCB; and
  means for dissipating heat away from the two heat-generating devices and the means for powering, wherein the means for powering is located at least partially in the space and is adjacent the means for dissipating heat.

16. The apparatus of claim 15 wherein the space is approximately equal to a surface area of the second PCB times a height of the means for connecting.

17. The apparatus of claim 15 wherein the two heat-generating devices include two processors.

18. The apparatus of claim 15 further comprising a plurality of electronic devices disposed in the space, the electronic devices generating less heat than the two heat-generating devices.

19. The apparatus of claim 15 wherein the first and second PCBs are parallel.

20. The apparatus of claim 15 wherein the means for dissipating heat generates an airflow pathway that is directed toward the space and the means for powering.

* * * * *